United States Patent
Arp et al.

(10) Patent No.: US 9,953,124 B2
(45) Date of Patent: *Apr. 24, 2018

(54) GENERATING A LAYOUT FOR AN INTEGRATED CIRCUIT

(71) Applicant: International Business Machines Corporation, Armonk, NY (US)

(72) Inventors: Andreas H. A. Arp, Nufringen (DE); Michael Koch, Ehningen (DE); Matthias Ringe, Tuebingen (DE)

(73) Assignee: International Business Machines Corporation, Armonk, NY (US)

( * ) Notice: Subject to any disclaimer, the term of this patent is extended or adjusted under 35 U.S.C. 154(b) by 127 days.

This patent is subject to a terminal disclaimer.

(21) Appl. No.: 15/058,599

(22) Filed: Mar. 2, 2016

(65) Prior Publication Data

US 2017/0161421 A1    Jun. 8, 2017

Related U.S. Application Data

(63) Continuation of application No. 14/962,708, filed on Dec. 8, 2015.

(51) Int. Cl.
*G06F 9/45*       (2006.01)
*G06F 17/50*      (2006.01)

(52) U.S. Cl.
CPC ...... *G06F 17/5072* (2013.01); *G06F 17/5009* (2013.01); *G06F 17/5045* (2013.01); *G06F 17/5077* (2013.01); *G06F 17/5081* (2013.01); *G06F 2217/62* (2013.01)

(58) Field of Classification Search
USPC .......................................... 716/112
See application file for complete search history.

(56) References Cited

U.S. PATENT DOCUMENTS

| | | | |
|---|---|---|---|
| 7,719,316 B2 | 5/2010 | Chueh et al. | |
| 8,659,338 B2 | 2/2014 | Papaefthymiou et al. | |
| 8,719,748 B2 | 5/2014 | Guthaus et al. | |
| 8,847,652 B2 | 9/2014 | Chern et al. | |
| 2013/0049826 A1* | 2/2013 | Kim | H03L 7/00 327/141 |
| 2013/0336082 A1 | 12/2013 | Khawshe et al. | |
| 2014/0223210 A1* | 8/2014 | Bucelot | G06F 1/10 713/322 |

(Continued)

OTHER PUBLICATIONS

Appendix P, List of IBM Patents or Patent Applications Treated as Related, 2 pages, dated Mar. 8, 2016.

(Continued)

*Primary Examiner* — Bryce Aisaka

(74) *Attorney, Agent, or Firm* — Christopher McLane; Daniel R. Simek

(57) ABSTRACT

In an approach for generating a file, a computer generates a modified layout for an integrated circuit. The computer receives a draft layout for an integrated circuit. The computer identifies a resonator, wherein the resonator comprises a capacitor connected to ground and an inductor connected to a clock grid. The computer creates alternative resonator wiring of the received draft layout associated with the identified resonator. The computer generates a modified draft layout based on the created alternative resonator wiring for the integrated circuit.

7 Claims, 7 Drawing Sheets

(56) References Cited

U.S. PATENT DOCUMENTS

2014/0245250 A1* 8/2014 Hibbeler ............ G06F 17/5045
716/133

OTHER PUBLICATIONS

Arp et al., "Generating a Layout for an Integrated Circuit", U.S. Appl. No. 14/962,708, filed Dec. 8, 2015, 34 pages.
"Addressing the Power-Performance IC Design Conundrum—A Novel Clock Design Technique to Reduce Power and Increase Performance", Cyclos Semiconductor, Jun. 1, 2012, 17 pages.

* cited by examiner

GENERATING A LAYOUT FOR AN INTEGRATED CIRCUIT

BACKGROUND

The present invention relates generally to the field of integrated circuits, and more particularly to generating a layout for an integrated circuit for manufacturing the integrated circuit.

In integrated circuits some components, such as flip flops, are provided with a clocking signal in order to switch the states of the flip flop according to the states of the inputs of the flip flops. To ensure that all the components on an integrated circuit are provided with the same clocking signal, basically two approaches are known. In a first approach, the clocking signal is generated by a single clock whereupon the clocking signal is spread into a tree like structure of individual clocking areas. As the electrical components of the clocking areas have to be switched at the same time, the clocking signal provided to the clocking areas are synchronized.

The synchronization of the clocking signal may, however, be omitted when the second approach for providing a clocking signal is chosen. In the second approach, the clocking signal is again generated by a single clock and spread into a plurality of "branches" of a tree-like structure. The individual branches are connected to a clock grid (clock mesh), which is spread over the entire chip that the integrated circuit is placed on. As a result, the clocking signal is fed into the clock grid.

In order to reduce the amount of energy that has to be fed into the clock grid to supply the clock grid with the clocking signal, the principle of "resonant clocking" has been introduced. In "resonant clocking," a plurality of resonators are connected to the clock grid to keep at least some of the energy that has been coupled into the clock grid oscillating in the clock grid. As a result, the amount of energy that has to be fed into the clock grid to maintain the clocking signal within the clock grid is reduced.

SUMMARY

Aspects of the present invention disclose a method, computer program product, and system for generating a modified layout for an integrated circuit. The method includes one or more computer processors receiving a draft layout for an integrated circuit. The method further includes one or more computer processors identifying a resonator, wherein the resonator comprises a capacitor connected to ground and an inductor connected to a clock grid. The method further includes one or more computer processors creating alternative resonator wiring of the received draft layout associated with the identified resonator. The method further includes one or more computer processors generating a modified draft layout based on the created alternative resonator wiring for the integrated circuit.

DETAILED DESCRIPTION

Figure 1:
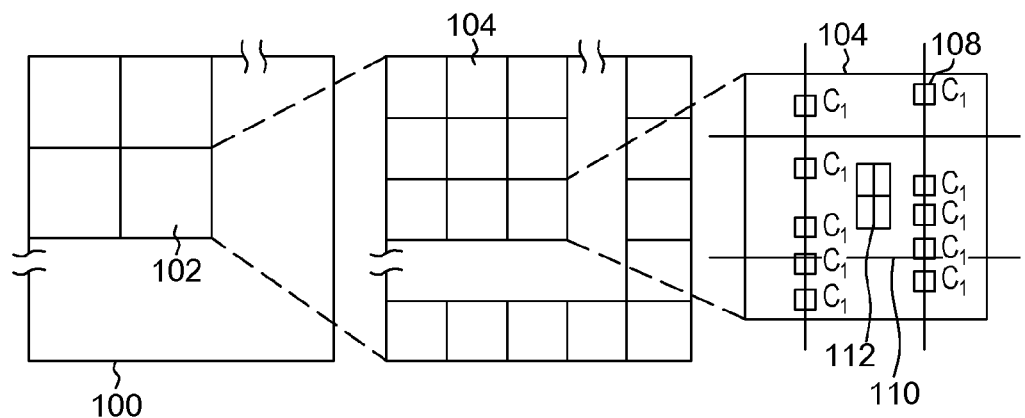
FIG. 1 depicts schematics of an integrated circuit and the corresponding simplified layout of a submesh and a sector of the integrated circuit, in accordance with an embodiment of the present invention.

Embodiments of the present invention relate to a method for generating a layout for an integrated circuit. For example, the integrated circuit may be embodied on a chip comprising a plurality of electrical components, such as flip flops. The flip flops are driven by a clocking signal, which is distributed using a clock grid. When generating the layout, the resonator wiring that connects the resonators of the integrated circuit to the clock grid are rearranged in order to reduce the wiring necessary to connect the resonators to the clock grid. Reducing the length of the resonator wiring may have multiple advantages that include: reducing the energy dissipation in the integrated circuit and freeing routing resources, which would otherwise be blocked by the resonator wiring. As a result, in accordance with embodiments of the present invention, the integrated circuit that is manufactured, based on the generated layout created, may be more efficient, as energy losses associated with operation of the integrated circuit can be reduced. Within embodiments of the present invention, the length of the original resonator wiring is the length of the accumulated length of all wires, which originally connect the resonator to the clock grid. Herein, the predefined threshold for the length of the original resonator wiring may even be zero, meaning that all resonator wirings of the layout are rearranged.

By simulating the clocking signal while using the layout that includes the rearranged resonator wiring, the clocking signal can be further tested to determine whether the clocking signal will change significantly when the resonator wiring is rearranged, in accordance with an embodiment of the present invention. For example, a direct connection of the resonators to the wires of a second set of wires that comprise the connection of the remaining components of the integrated circuit can be understood as capacitive loads, which may therefore result in echoes in the clocking signal. Thus, the clocking signal may be affected by the rearranged resonator wiring in such a way that the clocking signal can no longer be used to trigger the components of the integrated circuit. By simulating the clocking signal, embodiments of the present invention determine whether the clocking signal still satisfies predefined circuit specifications with regard to signal skew, spiking of the signal, over-shooting, or under-shooting of the signal relative to a reference value or general pulse shape. Layouts that include the rearranged resonator wiring are maintained and used for fabrication of the integrated circuit when the clocking signal still complies with the circuit specifications, otherwise the altered layout is discarded.

In yet another aspect the invention relates to an integrated circuit, the integrated circuit comprising a clock grid. The clock grid comprises a first set of wires and a second set of wires, the wires of the first set of wires being perpendicular to the wires of the second set of wires. The integrated circuit further comprises a plurality of capacitive loads, a plurality of clock drivers and a plurality of resonators. The clock drivers connect to the clock grid and feed a clocking signal into the clock grid. The resonators connect to the clock grid. The capacitive loads connect to the second set of wires. A first set of resonators connect to the first set of wires, and a second set of resonators connect to the second set of wires.

In some embodiments, the resonators comprise a capacitor and an inductor, the resonator wiring connects the inductor to the clock grid, and the capacitor connects to ground. In some further embodiments, the rearranged resonator wiring comprises determining a first wire of the clock grid, which is the shortest distance of all wires of the clock grid from the inductor of the resonator, and connecting the inductor of the resonator to the first wire, thereby creating the alternative resonator wiring. As described above, shortening the resonator wiring may reduce the dissipation of energy upon operation of the integrated circuit, and routing resources can therefore be freed.

In some embodiments, the inductance of the inductor is tunable. The tunable inductance allows alternative candidates to replace the initial candidate within the draft layout when the simulated clocking signal using the initial candidate for the modified draft layout does not satisfy the predefined circuit specifications. The method tunes the inductance of the inductor, resulting in an alternative candidate for a modified draft layout. The method simulates the clocking signal using the alternative candidate for the modified draft layout. The method determines whether the clocking signal satisfies predefined circuit specifications when utilizing the modified draft layout with the alternative candidate. If the method determines the clocking signal satisfies predefined circuit specifications when utilizing the modified draft layout with the alternative candidate, the method changes the modified draft layout to be a new draft layout, otherwise, the method discards the alternative candidate for a modified draft layout.

For example, the rearranged resonator wiring may result in a simulated clocking signal having a pulse shape which does not comply with circuit specifications. As the resonance frequency of the resonators affects the shape of the simulated clocking signal, tuning the inductor of a resonator may affect the resonance frequency of the resonator in such a way that the clocking signal, which is simulated using the tuned inductor of the resonator and the rearranged resonator wiring, again complies with the circuit specifications. Thus, negative effects that may occur in response to connecting the resonators directly to wires of the clock grid that connect directly to the capacitive loads of the integrated circuit, may potentially be compensated for.

In some embodiments, clock drivers are tunable. For example, the tuning may adjust a driving strength associated with the clock drivers or introduce an offset in the clocking signal that is fed into the clock grid. Additionally, the tuning may change the location of the connection of the clock drivers to the clock grid. The method, in which the simulated clocking signal does not satisfy the predefined circuit specifications, the method tunes the clock drivers, which results in an alternative candidate for a modified draft layout. The method simulates the clocking signal using the alternative candidate associated with the modified draft layout. The method determines whether the clocking signal using the alternative candidate associated with the modified draft layout satisfies predefined circuit specifications. If the method determines the clocking signal using the alternative candidate associated with the modified draft layout satisfies predefined circuit specifications, then the method utilizes the alternative candidate for the modified draft layout as the new draft layout. If the method determines the clocking signal using the alternative candidate associated with the modified draft layout does not satisfy predefined circuit specifications, then the method discards the alternative candidate for the modified draft layout.

As described before with reference to tuning the inductor of the resonators, embodiments that also include tunable clock drivers may have an advantage. By tuning the clock drivers possible detrimental effects, which may occur upon rearranging the resonator wiring in the course of the execution of the method for generating a layout, may be compensated for.

In some embodiments the method, after receiving the draft layout, further comprises subdividing the clock grid into submeshes and subdividing the submeshes into sectors. Each sector of the submesh comprises one resonator and at least one clock driver. Subdividing the overall layout of the integrated circuit may facilitate optimization of the layout by reducing the complexity and runtime of simulations of the clocking signal.

In some embodiments, the first set of wires is comprised in a first conductive layer of the integrated circuit, and the second set of wires is comprised in a second conductive layer of the integrated circuit. The first conductive layer and the second conductive layer are electrically separated by an insulating layer and the wires of the first set of wires and the wires of the second set of wires connect by vias. A via is an electrical connection between layers in a physical electronic circuit that goes through the plane of one or more adjacent layers. In integrated circuit design, the via is a small opening in an insulating oxide layer that allows a conductive connection between different layers. The via on an integrated circuit is often called a through-chip via.

FIG. 1 depicts a simplified layout of chip 100 comprising an integrated circuit. The integrated circuit may, for example, comprised of a plurality of electrical components (e.g., a plurality of flip-flops), which are interconnected using circuitry comprised in chip 100. In FIG. 1, chip 100 is subdivided into one or more instances of submesh 102, wherein individual instances of submesh 102 are further subdivided into a plurality of instances of sector 104. In the detailed view of an instance of sector 104 associated with chip 100 on the right side of FIG. 1, the electrical components of the integrated circuit are illustrated as capacitive loads 108. The electrical components are usually provided with a clocking signal, which may, for example, be a rectangular shape. In order to guarantee that all electrical components receive a clocking signal of a similar waveform, the clocking signal is fed into clock grid 110 (clock mesh) by a plurality of clock drivers 112 called sector buffers 113, in which clock grid 110 spans all over chip 100. Depending on the size of chip 100, the clocking signal may be fed into clock grid 110 by a plurality of clock drivers 112, which are distributed all over chip 100.

As illustrated in the right hand side of FIG. 1, clock grid 110 comprises horizontal wires and vertical wires. In one embodiment, the horizontal wires are comprised in a first conductive layer of chip 100 while the vertical wires are comprised in a second conductive layer of chip 100 wherein the first conductive layer and the second conductive layer are separated by an insulating layer. The vertical wires and the horizontal wires may then connect using via(s).

When using clock grid 110 to provide the electrical components of an integrated circuit with the clocking signal, clock drivers 112 feed significant amounts of energy into clock grid 110 in order to continuously provide the electrical components of the integrated circuit with the clocking signal.

Figure 2:
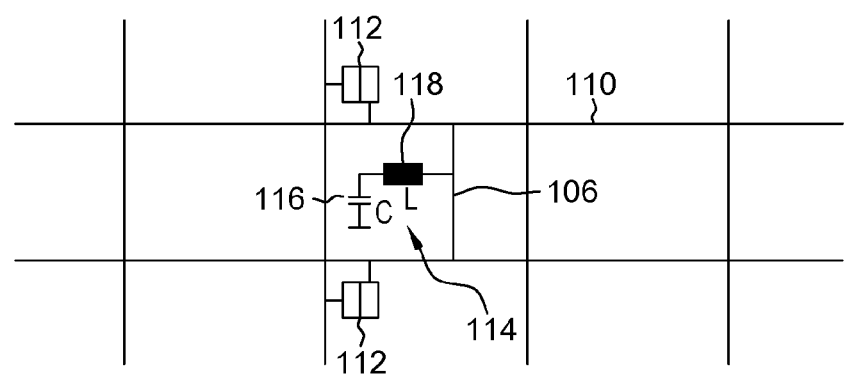
FIG. 2 depicts a simplified layout of the circuitry within a sector of the integrated circuit as known in the prior art, in accordance with an embodiment of the present invention.

FIG. 2 depicts a simplified layout of the circuitry within sector 104 of the integrated circuit. The circuitry of the integrated circuit comprises resonator 114 that connects to clock grid 110 via vertical wire 106. As further illustrated in FIG. 2, four instances of sector buffers 113 connect to clock grid 110. Clock grid 110 may include other amounts of horizontal and vertical wires and/or aspect ratio. Resonator 114 comprises capacitor 116 as well as inductor 118. Capacitor 116 connects to ground and to inductor 118, and inductor 118 connects to the horizontal wires of clock grid 110 via vertical wire 106. Introducing resonator 114 into clock grid 110 will result in inductor 118, when driven by clock drivers 112 with the clocking signal, starting to oscillate, and thereby keeping part of the energy fed into clock grid 110 oscillating within clock grid 110.

As described with reference to FIG. 1, the electrical components of the integrated circuit can be understood as capacitive loads 108 that connect to clock grid 110. As a result, resonator 114 may, for example, only comprise inductor 118 wherein the inductance of inductor 118 has to be chosen such that the resonance frequency of resonator 114 matches the frequency of the clocking signal that clock drivers 112 feed into clock grid 110. Thus, when designing resonator 114, capacitor 116 of the electrical components of the integrated circuit are considered.

As further illustrated in FIG. 1, the electrical components connect to only the vertical wires of clock grid 110. As a result, advantages may result by connecting resonator 114 to only the horizontal wires of clock grid 110 such as to avoid reflections in the clocking signal caused by capacitive loads 108 of the electrical components.

Yet in some embodiments of the present invention, resonator 114 may connect directly to the vertical wires of clock grid 110 without taking the risk that the clocking signal deviates too much from the clocking signal which is fed into clock grid 110 by the sector buffers 113.

Figure 3A:
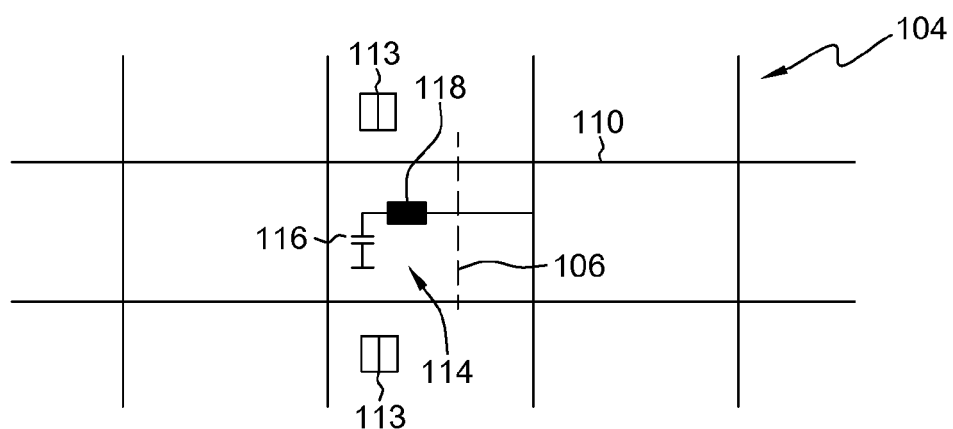
FIG. 3a depicts a layout of circuitry that includes resonator wiring, in accordance with an embodiment of the present invention.
Figure 3B:
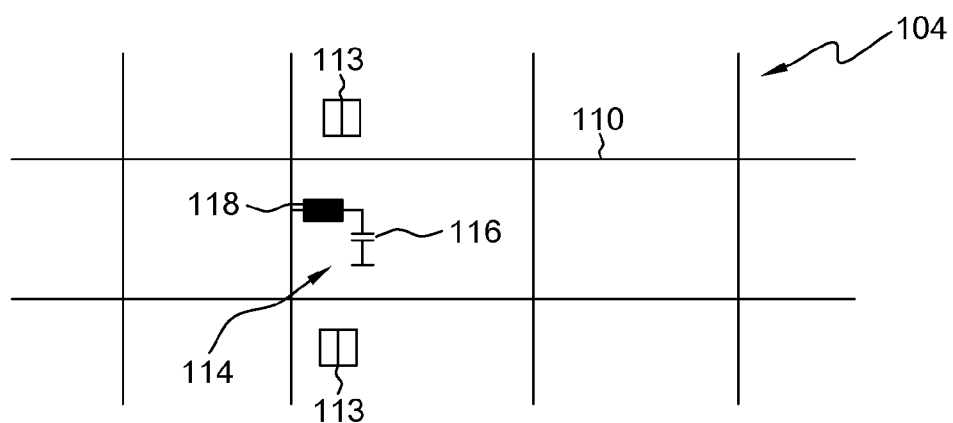
FIG. 3b depicts simplified layout of the circuitry after rearranging of the resonator wiring, in accordance with an embodiment of the present invention.

In accordance with embodiments of the present invention, the layout of the integrated circuit as depicted in FIG. 2, is amended in that resonator 114 or inductor 118 of resonator 114 connect directly to the vertical wires of the clock grid 110 instead of connecting inductor 118 to the horizontal wires of clock grid 110 as depicted in FIG. 3a and FIG. 3b. Comparing FIG. 2 and FIG. 3a and FIG. 3b, the direct connection of inductor 118 to the vertical wires of clock grid 110 results in a shortened length of the wiring, which may allow for a reduction in the dissipation power and freeing of routing resources within the layout. In accordance with an embodiment, the method for generating the layout for the integrated circuit comprises scanning the layout for instances of resonator 114 and determining whether the length of the resonator wiring connecting instances of resonator 114 to clock grid 110 exceeds a predefined threshold. In instances in which the length of the resonator wiring does exceed the predefined threshold, the original resonator wiring is deleted and the corresponding instance of resonator 114 directly connects to the vertical wires of clock grid 110.

As described before, a direct connection of resonator 114 to the vertical wires of clock grid 110 may result in a waveform of the clocking signal that deviates from the expected waveform, which sector buffers 113 feeds into clock grid 110. Thus after rearranging the resonator wiring, an evaluation occurs to determine whether the resulting clocking signal will still satisfy the specifications of the circuit with regards to the waveform such as when concerning skew and slew. Thus the new layout (e.g., modified draft layout) of the integrated circuit, with the rearranged resonator wiring, simulates the clocking signal in order to determine whether the circuit specifications are still met. In instances in which the circuit specifications are still met, the new layout for the integrated circuit is used for further iterations whereas in instances in which the clocking signal does not satisfy the predefined circuit specifications anymore, the new layout for the integrated circuit is discarded and the rearrangement of the resonator wiring is revoked. The procedure repeats for all instances of resonator 114 within the integrated circuit.

As described before, connecting resonator 114 directly to the vertical wires of clock grid 110 that comprise capacitive loads 108 of the electrical components of the integrated circuit may lead to degradation of the clocking signal, which is oscillating in clock grid 110. However, in some instances, the degradation may be overcome by retuning inductor 118 or sector buffers 113. On behalf of inductor 118, retuning may comprise altering the inductance of inductor 118 thereby shifting the resonance frequency of resonator 114. As a result, the waveform of the clock signal oscillating within clock grid 110 may improve. On behalf of sector buffers 113, retuning may comprise an increase or decrease in the amount of energy that feeds into clock grid 110, which may also result in an improved clocking signal oscillating within clock grid 110. However, in some instances, even retuning inductor 118 or sector buffers 113 does not lead to an improved clocking signal, and therefore, the rearranged resonator wiring (e.g., modified draft layout) is discarded. Additionally, another instance of resonator 114 in another instance of sector 104 is determined whereupon the resonator wiring of another instance of resonator 114 is altered as described before.

Figure 4A:
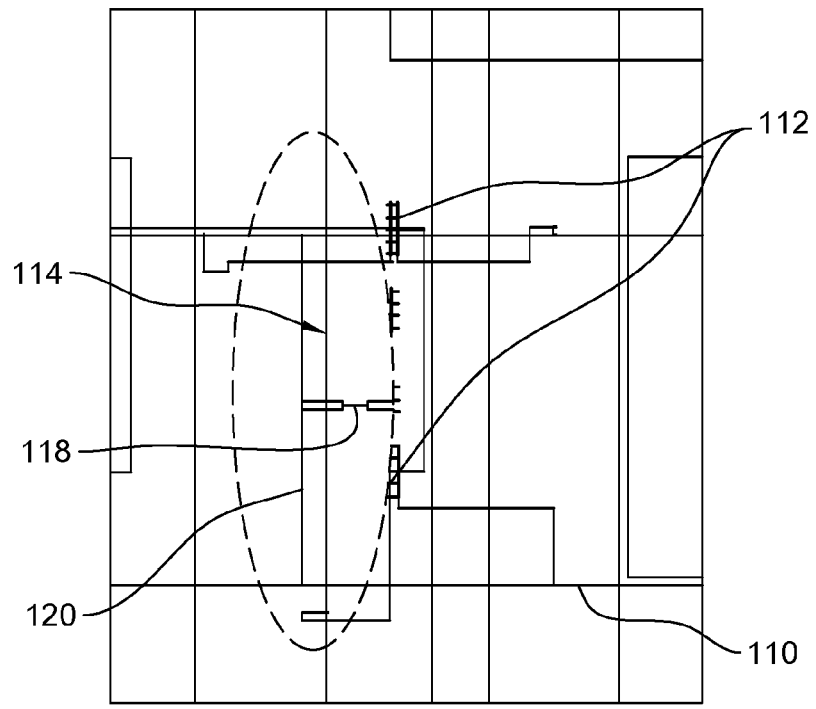
FIG. 4a depicts a view of a sector layout that includes resonator wiring, in accordance with an embodiment of the present.
Figure 4B:
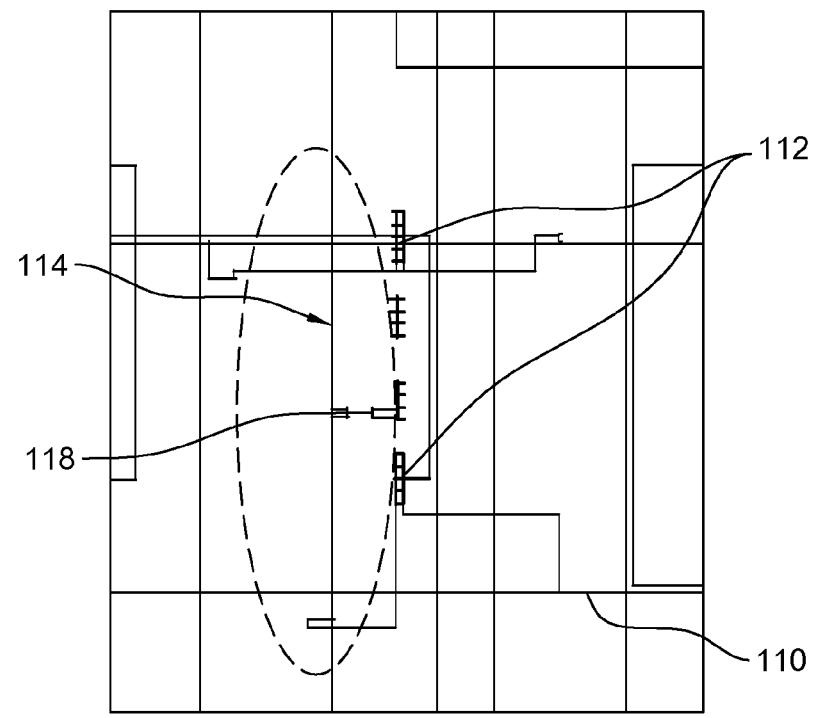
FIG. 4b depicts a simplified view of a sector layout after rearranging of the resonator wiring, in accordance with an embodiment of the present invention.

FIG. 4a and FIG. 4b depict simplified layouts of a sector layout prior to and after rearranging of the resonator wiring. FIG. 4a shows a part of a sector 104 of the layout of the integrated circuit. Sector 104 comprises four sector buffers 113 and resonator 114 wherein only inductor 118 of resonator 114 is shown. Resonator 114 is located inside the white circle while sector buffers 113 are located on the right side outside of the white circle. As depicted in FIG. 4a, resonator 114 connects to the horizontal wires of clock grid 110 via vertical wire 120. FIG. 4b depicts the layout of the same instance of sector 104 but after rearranging the resonator wiring, in accordance with an embodiment of the invention. As depicted in FIG. 4b, inductor 118 of resonator 114 now connects directly to vertical wire 122 of clock grid 110, which results in a shortened resonator wiring. Vertical wire 120, which originally connects inductor 118 to the horizontal wires of clock grid 110 in FIG. 4a, is omitted in FIG. 4b. As a result of the omission of vertical wiring 120, dissipation power can be reduced and routing tracks can be freed.

Figure 5:
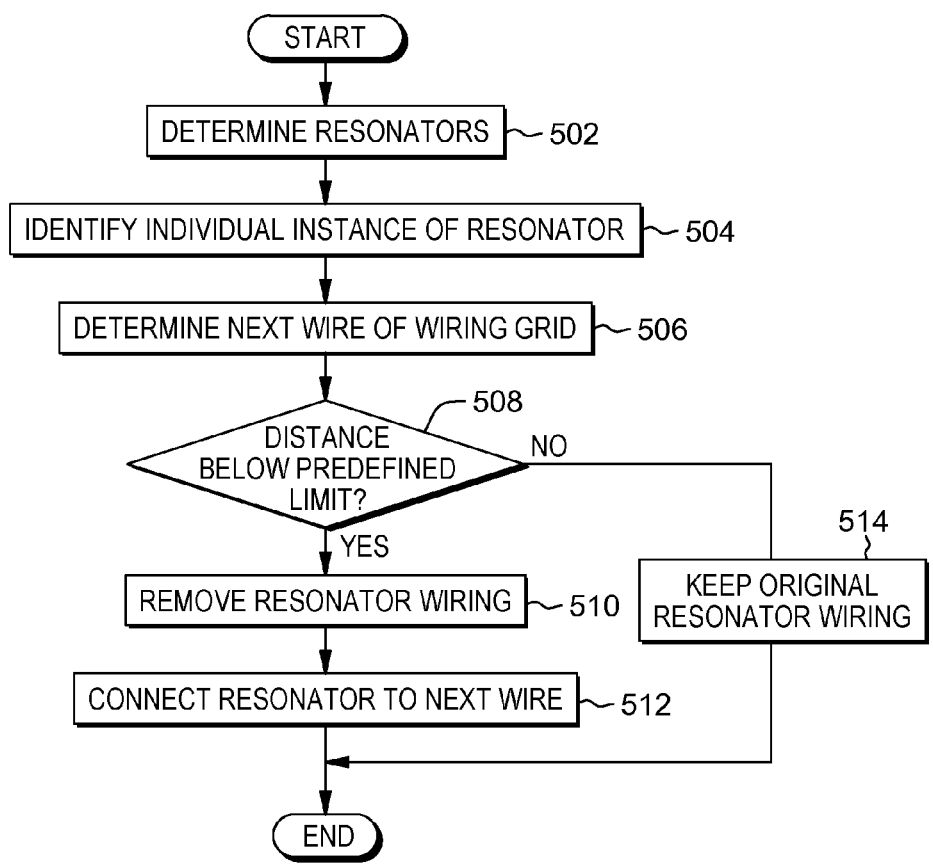
FIG. 5 depicts a flow diagram of a first embodiment of a method for generating a layout, in accordance with an embodiment of the present invention.

FIG. 5 depicts a flow diagram of a first embodiment of a method for generating a layout. In step 502, the method initiates by determining instances of resonator 114 (e.g., may include multiple instances of resonator 114) comprised in the layout of the integrated circuit. In step 504, the method identifies individual instances of resonator 114. For each individual instance of resonator 114, in step 506, the method determines the next wire of clock grid 110. In decision 508, the method determines whether the distance of the determined next wire from resonator 114 is below a predefined limit. If the method determines the distance of the determined next wire from the resonator 114 is below the predefined limit (decision 508, yes branch), then the method removes original resonator wiring (step 510). Additionally in step 512, the method connects resonator 114 to the previously determined next wire of clock grid 110. If the method determines the distance of the determined next wire from the resonator 114 is not below the predefined limit (decision 508, no branch), then the method maintains (e.g., keeps) the original resonator wiring (step 514). Upon completion the method repeats when an additional instance of resonator 114 exists in which the method has not determined the next wire.

Figure 6:
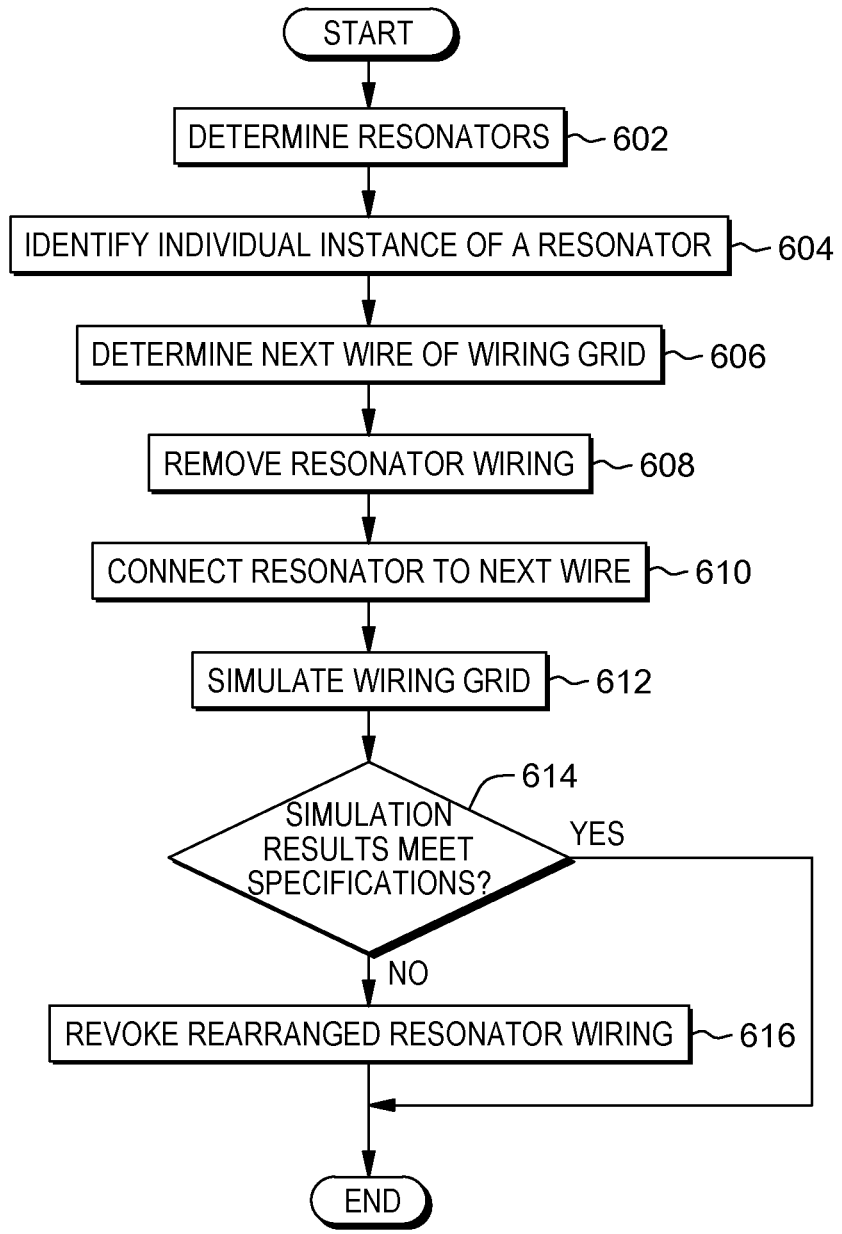
FIG. 6 depicts a flow diagram of a second embodiment of a method for generating a layout, in accordance with an embodiment of the present invention.

FIG. 6 depicts a flow diagram of a second embodiment of a method for generating a layout for an integrated circuit. In step 602, the method scans the layout of the integrated circuit for instances of resonator 114. In step 604, the method identifies an individual instance of resonator 114 from the determined instances of resonator 114. In step 606, the method determines the next wire of clock grid 110. The next wire is the wire with the shortest distance from resonator 114 in comparison to the remaining wires of clock grid 110. In step 608, the method removes the original wiring connecting resonator 114 to clock grid 110. In step 610, the method connects resonator 114 to the next wire as determined previously in step 606 (e.g., creates alternative resonator wiring). Additionally, the method updates the layout to a modified draft layout (e.g., removes original resonator wiring and adds the alternative resonator wiring). In step 612, the method simulates the clocking signal oscillating in clock grid 110 using the new resonator wiring for clock grid 110. In decision 614, the method determines whether the clocking signal associated with the new resonator wiring, meets specifications. If the method determines the clocking signal associated with the new resonator wiring, meets specifications (decision 614, yes branch), then the method keeps the new layout (e.g., modified draft layout). Upon completion the method repeats when an additional instance of resonator 114 exists in which the method has not determined the next wire. The method returns and identifies another individual instance of resonator 114 (step 604). If the method determines the clocking signal associated with the new resonator wiring, does not meet specifications (decision 614, no branch), then the method revokes the rearranged resonator wiring (step 616) The method repeats the steps for rearranging the resonator, and identifies another instance of resonator 114 of the integrated circuit (step 604).

Figure 7:
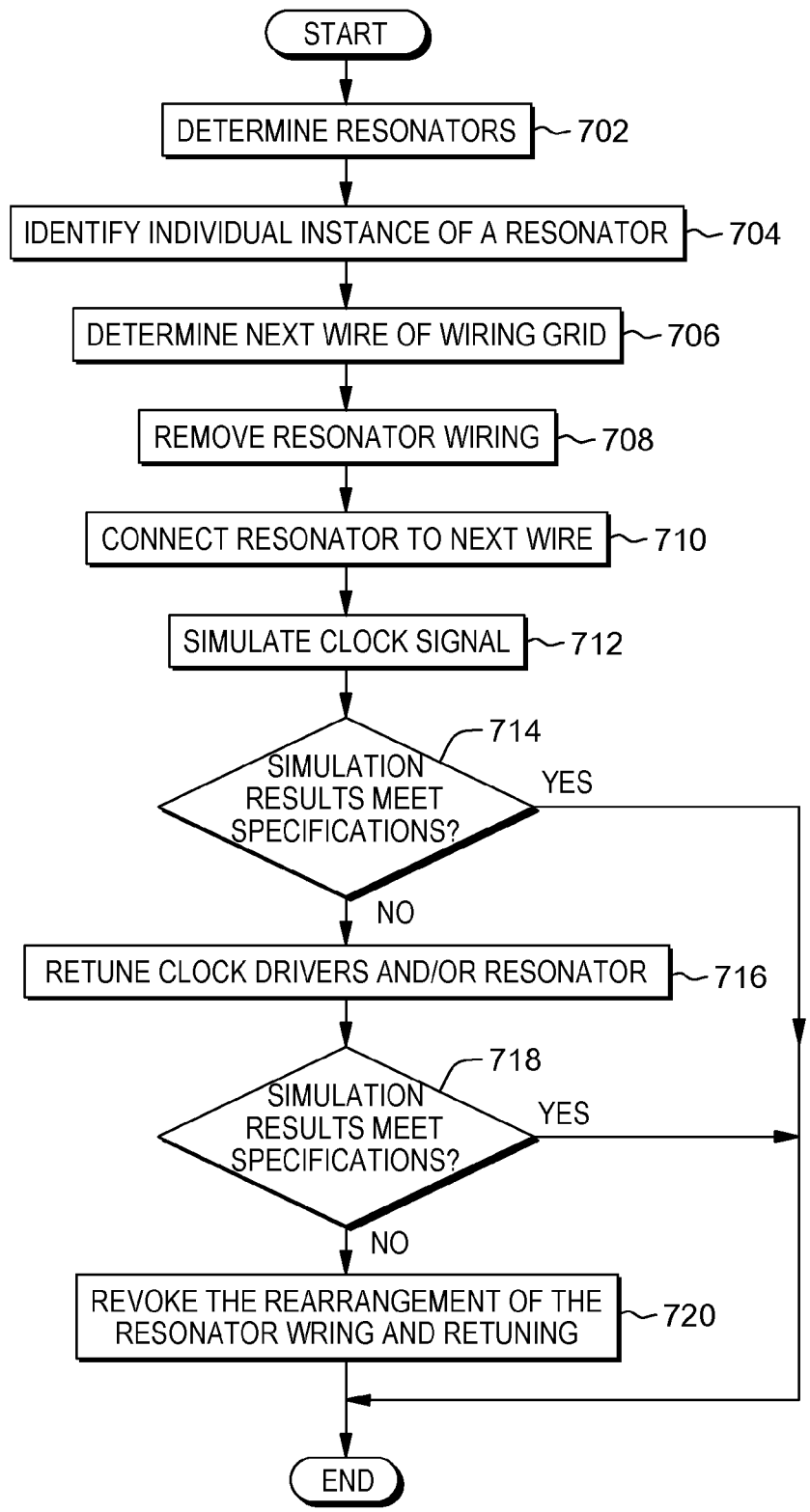
FIG. 7 depicts a flow diagram of a third embodiment of a method for generating a layout, in accordance with an embodiment of the present invention.

FIG. 7 depicts a flow diagram of a third embodiment of a method for generating layout for an integrated circuit. In step 702 of the depicted embodiment, the method scans a starting layout of the integrated circuit for instances of resonator 114. In step 704, the method identifies an instance of resonator 114 in which the next wire was not previously identified. In step 706, the method determines the next wire of clock grid 110 associated with the identified instance of resonator 114. In step 708, the method removes the original resonator wiring. In step 710, the method connects the identified instance of resonator 114 to the next wire determined previously in step 706. With the resulting new resonator wiring, in step 712, the method simulates the clocking signal, which oscillates in clock grid 110. In decision 714, the method determines whether the simulated clocking signal meets the specifications based on the new resonator wiring. If the method determines the simulated clocking signal meets the specifications based on the new resonator wiring (decision 714, yes branch), then the method keeps the new resonator wiring, and completes.

Upon completion the method returns to identify another instance of resonator 114 from a plurality of instances of resonator 114. If the method determines the simulated clocking signal does not meet the specifications based on the new resonator wiring (decision 714, no branch), then the method retunes clock drivers 112 and/or resonator 114 of an instance of sector 104 that includes resonator 114 (step 716). In decision 718, the method determines whether the retuning of clock drivers 112 and/or resonator 114 results in an improved clocking signal that meets the specifications. If the method determines the retuning of clock drivers 112 and/or resonator 114 results in an improved clocking signal that meets the specifications (decision 718, yes branch) then, the method keeps the improved resonator wiring and the new settings for clock drivers 112 and/or resonator 114 (e.g., stores the modified draft layout).

Upon completion the method repeats for another instance of resonator 114 from the plurality instances of resonator 114 until the method analyses each instance of resonator 114 within the plurality instances of resonator 114. If the method determines the retuning of clock drivers 112 and/or resonator 114 does not result in an improved clocking signal that still does not meet the specifications (decision 718, no branch), then the method revokes the complete rearrangement of the resonator wiring (e.g., returns clock drivers 112 and/or resonator 114 to the state prior to retuning, reestablishes the original wiring (step 720). Upon completion the method repeats for another instance of resonator 114 from the plurality instances of resonator 114 until the method analyses each instance of resonator 114 within the plurality instances of resonator 114.

Figure 8:
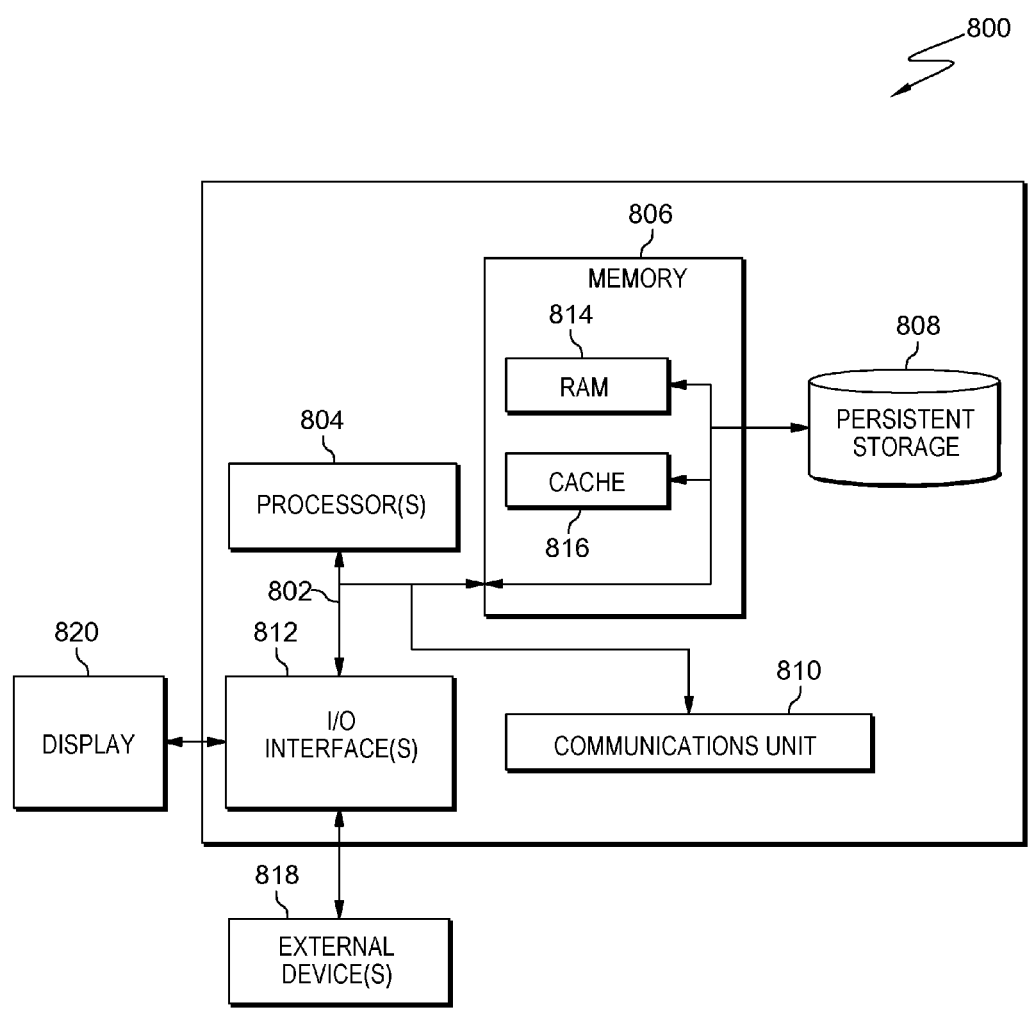
FIG. 8 is a block diagram of components of the computer executing the software and data to perform the methods of FIGS. 5, 6, and 7, in accordance with an embodiment of the present invention.

FIG. 8 depicts a block diagram of components of computer 800, in accordance with an illustrative embodiment of the present invention. It should be appreciated that FIG. 8 provides only an illustration of one implementation and does not imply any limitations with regard to the environments in which different embodiments may be implemented. Many modifications to the depicted environment may be made.

Computer 800 includes communications fabric 802, which provides communications between cache 816, memory 806, persistent storage 808, communications unit 810, and input/output (I/O) interface(s) 812. Communications fabric 802 can be implemented with any architecture designed for passing data and/or control information between processors (such as microprocessors, communications and network processors, etc.), system memory, peripheral devices, and any other hardware components within a system. For example, communications fabric 802 can be implemented with one or more buses or a crossbar switch.

Memory 806 and persistent storage 808 are computer readable storage media. In this embodiment, memory 806 includes random access memory (RAM) 814. In general, memory 806 can include any suitable volatile or non-volatile computer readable storage media. Cache 816 is a fast memory that enhances the performance of computer processor(s) 804 by holding recently accessed data, and data near accessed data, from memory 806.

The software and data to perform the methods of FIGS. 5, 6, and 7, may be stored in persistent storage 808 and in memory 806 for execution and/or access by one or more of the respective computer processor(s) 804 via cache 816. In an embodiment, persistent storage 808 includes a magnetic hard disk drive. Alternatively, or in addition to a magnetic hard disk drive, persistent storage 808 can include a solid-state hard drive, a semiconductor storage device, a read-only memory (ROM), an erasable programmable read-only memory (EPROM), a flash memory, or any other computer readable storage media that is capable of storing program instructions or digital information.

The media used by persistent storage 808 may also be removable. For example, a removable hard drive may be used for persistent storage 808. Other examples include optical and magnetic disks, thumb drives, and smart cards that are inserted into a drive for transfer onto another computer readable storage medium that is also part of persistent storage 808.

Communications unit 810, in these examples, provides for communications with other data processing systems or devices. In these examples, communications unit 810 includes one or more network interface cards. Communications unit 810 may provide communications through the use of either or both physical and wireless communications links. The software and data to perform the methods of FIGS. 5, 6, and 7, may be downloaded to persistent storage 808 through communications unit 810.

I/O interface(s) 812 allows for input and output of data with other devices that may be connected to computer 800. For example, I/O interface(s) 812 may provide a connection to external device(s) 818, such as a keyboard, a keypad, a touch screen, and/or some other suitable input device. External devices 818 can also include portable computer readable storage media such as, for example, thumb drives, portable optical or magnetic disks, and memory cards. Software and data used to practice embodiments of the present invention, e.g., the software and data to perform the methods of FIGS. 5, 6, and 7, can be stored on such portable computer readable storage media and can be loaded onto persistent storage 808 via I/O interface(s) 812. I/O interface(s) 812 also connect to a display 820.

Display 820 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for generating a modified layout for an integrated circuit, the method comprising:
   receiving, by one or more computer processors, a draft layout for an integrated circuit;
   identifying, by one or more computer processors, a resonator, wherein the resonator comprises a capacitor connected to ground and an inductor connected to a clock grid;
   determining, by one or more computer processors, a first wire of the clock grid, wherein the first wire is a shortest distance of remaining wires of the clock grid from the inductor of the identified resonator;
   connecting, by one or more computer processors, the inductor of the identified resonator to the first wire, thereby creating alternative resonator wiring;
   removing, by one or more computer processors, the identified resonator wiring from the draft layout;
   creating, by one or more computer processors, alternative resonator wiring of the received draft layout associated with the identified resonator;
   generating, by one or more computer processors, a modified draft layout based on the created alternative resonator wiring for the integrated circuit;
   causing, by one or more computer processors, manufacture of an integrated circuit based on the generated modified draft layout.

2. The method of claim 1, wherein the integrated circuit comprises:
   a clock grid that comprises a first set of wires and a second set of wires in which the first set of wires are perpendicular to the second set of wires;
   a plurality of capacitive loads connected to the second set of wires;
   a plurality of clock drivers connected to the clock grid and being adapted to feed a clocking signal into the clock grid;
   a plurality of resonators connected to the first set of wires;
   a first conductive layer of the integrated circuit that includes the first set of wires;
   a second conductive layer of the integrated circuit that includes the second set of wires;
   an insulating layer electrically separating the first conductive layer and the second; conductive layer; and
   a via, connecting wires of the first set of wires and wires of the second set of wires.

3. The method of claim 1, further comprising;
   simulating, by one or more computer processors, a clocking signal within the modified draft layout; and
   determining, by one or more computer processors, whether the simulated clocking signal within the modified draft layout meets specifications.

4. The method of claim 3, further comprising:
   responsive to determining the simulated clocking signal within the modified draft layout meets specifications, storing, by one or more computer processors, the generated modified draft layout as a new layout.

5. The method of claim 3, further comprising:
   responsive to determining the simulated clocking signal within the modified draft layout does not meet specifications; retuning, by one or more computer processors, one or more of: a clock driver and an identified resonator within the modified draft layout;
   simulating, by one or more computer processors, a clocking signal within the retuned modified draft layout; and
   determining, by one or more computer processors, whether the simulated clocking signal within the retuned modified draft layout meets specifications.

6. The method of claim 5, further comprising:
   responsive to determining the simulated clocking signal within the retuned modified draft layout does not meet specifications, discarding, by one or more computer processors, the retuned modified draft layout; and
   utilizing, by one or more computer processors, the received draft layout.

7. The method of claim 5, further comprising:
   responsive to determining the simulated clocking signal within the retuned modified draft layout meets specifications, storing, by one or more computer processors, the generated modified draft layout as a new layout.

* * * * *